United States Patent
Ye

(10) Patent No.: US 10,903,288 B2
(45) Date of Patent: Jan. 26, 2021

(54) DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 70 days.

(21) Appl. No.: 16/309,381

(22) PCT Filed: Nov. 5, 2018

(86) PCT No.: PCT/CN2018/113955
§ 371 (c)(1),
(2) Date: Dec. 12, 2018

(87) PCT Pub. No.: WO2020/052029
PCT Pub. Date: Mar. 19, 2020

(65) Prior Publication Data
US 2020/0083304 A1      Mar. 12, 2020

(51) Int. Cl.
*H01L 51/52* (2006.01)
*H01L 27/32* (2006.01)
(Continued)

(52) U.S. Cl.
CPC ........ *H01L 27/3234* (2013.01); *G06K 9/0004* (2013.01); *G06K 9/209* (2013.01);
(Continued)

(58) Field of Classification Search
CPC ............... H01L 27/3234; H01L 27/323; H01L 27/14678; H01L 25/167
See application file for complete search history.

(56) References Cited

U.S. PATENT DOCUMENTS 10,216,975 B1 * 2/2019 He ..................... G06K 9/2018
2005/0200734 A1   9/2005 Ahn et al.
(Continued)

FOREIGN PATENT DOCUMENTS

| CN | 106298856 A | 1/2017 |
| CN | 106886767 A | 6/2017 |

(Continued)

*Primary Examiner* — Jaehwan Oh
(74) *Attorney, Agent, or Firm* — Muncy, Geissler, Olds & Lowe, P.C.

(57) ABSTRACT

A display panel of the present disclosure includes a substrate layer, a light emitting layer and a plurality of photosensitive elements, the light emitting layer includes a plurality of pixel units, the photosensitive elements are formed between the pixel units, the photosensitive elements are configured to sensing light reflected by the fingers and emitted by the pixel units for fingerprint identification, when the finger attaches to the display panel, the light emitted by the light emitting layer and reflected by the fingers reaches the photosensitive elements, the photosensitive elements receive the light for fingerprint identification.

18 Claims, 6 Drawing Sheets

(51) Int. Cl.
*G06K 9/20* (2006.01)
*G06K 9/00* (2006.01)

(52) U.S. Cl.
CPC ........ *H01L 27/322* (2013.01); *H01L 27/3244* (2013.01); *H01L 51/5253* (2013.01); *H01L 51/5275* (2013.01)

(56) References Cited

U.S. PATENT DOCUMENTS

| | | | |
|---|---|---|---|
| 2012/0241825 A1* | 9/2012 | Aichi | G02F 1/1368 257/290 |
| 2013/0037815 A1* | 2/2013 | Okajima | H01L 27/14678 257/59 |
| 2013/0119237 A1* | 5/2013 | Raguin | H01L 27/14601 250/208.1 |
| 2015/0331508 A1* | 11/2015 | Nho | H01L 27/323 345/173 |
| 2017/0228579 A1* | 8/2017 | Zhu | G06K 9/0004 |
| 2018/0005007 A1 | 1/2018 | Du et al. | |
| 2018/0019288 A1 | 1/2018 | Yang et al. | |
| 2018/0211088 A1* | 7/2018 | Cho | H01L 27/3262 |
| 2019/0006441 A1 | 1/2019 | Ling et al. | |
| 2019/0050621 A1 | 2/2019 | Xu et al. | |
| 2019/0067385 A1 | 2/2019 | Xu et al. | |
| 2019/0095674 A1* | 3/2019 | Ko | H01L 27/3227 |
| 2019/0310724 A1* | 10/2019 | Yeke Yazdandoost | G06F 3/0412 |

FOREIGN PATENT DOCUMENTS

| | | |
|---|---|---|
| CN | 107066162 A | 8/2017 |
| CN | 107068716 A | 8/2017 |
| CN | 107133613 A | 9/2017 |
| CN | 107579101 A | 1/2018 |

\* cited by examiner

DISPLAY PANEL

CROSS REFERENCE TO RELATED APPLICATIONS

This application claims the priority of International Application No. PCT/CN2018/113955, filed on 2018 Nov. 5, which claims priority to Chinese Application No. 201811060050.3, filed on 2018 Sep. 12. The entire disclosures of each of the above applications are incorporated herein by reference.

BACKGROUND OF INVENTION

Field of Invention

The present invention relates to the field of display technology, and particularly to a display panel having a fingerprint identification device thereunder.

Description of Prior Art

In the prior art, a touch display panel and a fingerprint identification module of an electronic device are usually independently formed. If the fingerprint identification module is disposed in a back side of the electronic device, an opening is defined in a shell of the electronic device so that the fingerprint identification module is embedded in the electronic device. Such a prior art practice affects the integrity of the electronic device. If the fingerprint identification module is formed at a front side of the electronic device, the fingerprint identification module occupies a part of an area of the display to reduce a screen-to-body ratio. Therefore, it is necessary to provide a display panel combining a touch display panel and a fingerprint identification module to realize a display panel having a fingerprint identification device thereunder.

SUMMARY OF INVENTION

The present invention provides a display panel, to realize a screen fingerprint identification device.

The present disclosure provides a display panel, including:

a substrate layer;

a light emitting layer formed on the substrate layer, wherein the light emitting layer includes a plurality of pixel units;

a plurality of photosensitive elements, wherein the photosensitive elements are formed between the pixel units, the photosensitive elements are configured to sensing light reflected by the fingers and emitted by the pixel units for fingerprint identification, the photosensitive elements are image sensors.

In one embodiment of the display panel of the present disclosure, the substrate layer includes a base substrate, the photosensitive elements are formed between the base substrate and the light emitting layer.

In one embodiment of the display panel of the present disclosure, the light emitting layer includes an anode layer, the anode layer and the photosensitive elements are formed in a same layer.

In one embodiment of the display panel of the present disclosure, a plurality of thin film transistors (TFT) is formed between the base substrate and the light emitting layer, each TFT includes a source/drain electrode, and the source % drain electrodes are electrically connected to the photosensitive elements.

In one embodiment of the display panel of the present disclosure, the substrate layer includes a base substrate, the photosensitive elements are formed on the base substrate away from the light emitting layer.

In one embodiment of the display panel of the present disclosure, a filter layer is formed on base substrate away from the light emitting layer, a plurality of through holes is defined in the filter layer, and the photosensitive elements are formed in the through holes.

In one embodiment of the display panel of the present disclosure, the display panel further includes a plurality of lenses, the lenses are formed on the light emitting layer of the display panel, and at least one lens is formed on a light pathway of the photosensitive elements.

In one embodiment of the display panel of the present disclosure, the display panel further includes a thin film encapsulation layer, the thin film encapsulation layer covers the light emitting layer and the lenses.

In one embodiment of the display panel of the present disclosure, a plurality of protrusions is formed on a surface of the thin film encapsulation layer away from the lighting emitting layer, the protrusions and the lenses are spaced from each other.

In one embodiment of the display panel of the present disclosure, the protrusions and lenses are made of a same material.

The present disclosure provides a display panel, including:

a substrate layer;

a light emitting layer formed on the substrate layer, wherein the light emitting layer includes a plurality of pixel units;

a plurality of photosensitive elements, wherein the photosensitive elements are formed between the pixel units, the photosensitive elements are configured to sensing light reflected by the fingers and emitted by the pixel units for fingerprint identification.

In one embodiment of the display panel of the present disclosure, the substrate layer includes a base substrate, the photosensitive elements are formed between the base substrate and the light emitting layer.

In one embodiment of the display panel of the present disclosure, the light emitting layer includes an anode layer, the anode layer and the photosensitive elements are formed in a same layer.

In one embodiment of the display panel of the present disclosure, a plurality of thin film transistors (TFT) is formed between the base substrate and the light emitting layer, each TFT comprises a source/drain electrode, and the source/drain electrodes are electrically connected to the photosensitive elements.

In one embodiment of the display panel of the present disclosure, the substrate layer includes a base substrate, the photosensitive elements are formed on the base substrate away from the light emitting layer.

In one embodiment of the display panel of the present disclosure, a filter layer is formed on base substrate away from the light emitting layer, a plurality of through holes is defined in the filter layer, and the photosensitive elements are formed in the through holes.

In one embodiment of the display panel of the present disclosure, the display panel further includes a plurality of lenses, the lenses are formed on the light emitting layer of the display panel, and at least one lens is formed on a light pathway of the photosensitive elements.

In one embodiment of the display panel of the present disclosure, the display panel further includes a thin film encapsulation layer, the thin film encapsulation layer covers the light emitting layer and the lenses.

In one embodiment of the display panel of the present disclosure, a plurality of protrusions is formed on a surface of the thin film encapsulation layer away from the lighting emitting layer, the protrusions and the lenses are spaced from each other.

In one embodiment of the display panel of the present disclosure, the protrusions and lenses are made of a same material.

The beneficial effect of the display panel of the present disclosure is that the display panel of the present disclosure includes a substrate layer, a light emitting layer and a plurality of photosensitive elements. The light emitting layer includes a plurality of pixel units. The photosensitive elements are formed between the pixel units. The photosensitive elements are configured to sense light reflected by the fingers and emitted by the pixel units for performing the fingerprint identification, while the light emitted by the light emitting layer is used for display. When the finger touches to the display panel and the light of the light emitting layer is reflected by the finger to the photosensitive elements, the photosensitive elements receive the light for performing the fingerprint identification whereby a display panel which can fulfill a fingerprint identification under the display panel is realized.

BRIEF DESCRIPTION OF DRAWINGS

In order to explain more clearly the embodiments in the present application or the technical solutions in the prior art, the following will briefly introduce the figures needed in the description of the embodiments or the prior art. Obviously, figures in the following description are only some embodiments of the present application, and for an ordinary person skilled in the art, other figures may also be obtained based on these figures without paying creative efforts.

DETAILED DESCRIPTION OF PREFERRED EMBODIMENTS

In order to enable the persons skilled in the art to better understand the technical solutions of the present application, a clear and comprehensive description will be made to the technical solutions in the embodiments of the present application in the following in combination with the figures in the embodiments of the present application, obviously, the embodiments described herein are only part of the embodiments of the present application rather than the entire embodiments of the application. Based on the embodiments of the present application, all other embodiments obtained by ordinary skilled persons in the field without paying creative efforts should pertain to the extent of protection of the present application.

Figure 1:
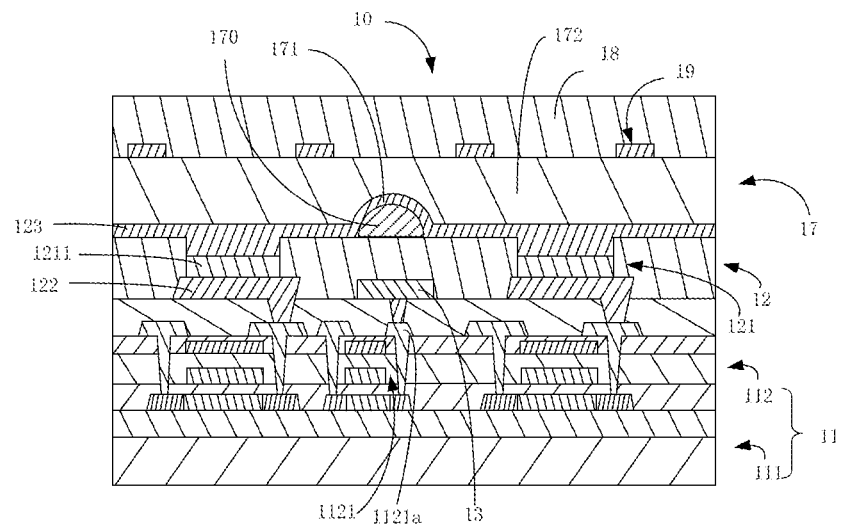
FIG. 1 is a cross-section view of a display panel of a first exemplary embodiment of the present disclosure.

Referring to FIG. 1, a display panel 10 configured for achieving a fingerprint identification under the display panel is provided.

The display panel 10 includes a substrate layer 11, a light emitting layer 12, and a plurality of photosensitive elements 13.

The substrate layer 11 includes a base substrate 111 and a circuit layer 112. The light emitting layer 12 is formed on the substrate layer 11. The circuit layer 112 is formed between the base substrate 111 and the light emitting layer 12. The light emitting layer 12 includes a plurality of pixel units 121. The photosensitive elements 13 are formed between the pixel units 121, and the photosensitive elements 13 are formed in gaps defined between the pixel units 121. The photosensitive elements 13 are configured to sense light reflected by the fingers and emitted by the pixel units to perform a fingerprint identification.

The circuit layer 112 includes a plurality of thin film transistors (TFT) 1121. Each TFT 1121 includes a source/drain electrode 1121a. The photosensitive elements 13 are connected to the source/drain electrodes 1121a, and the photosensitive elements 13 are image sensors.

Figure 2:
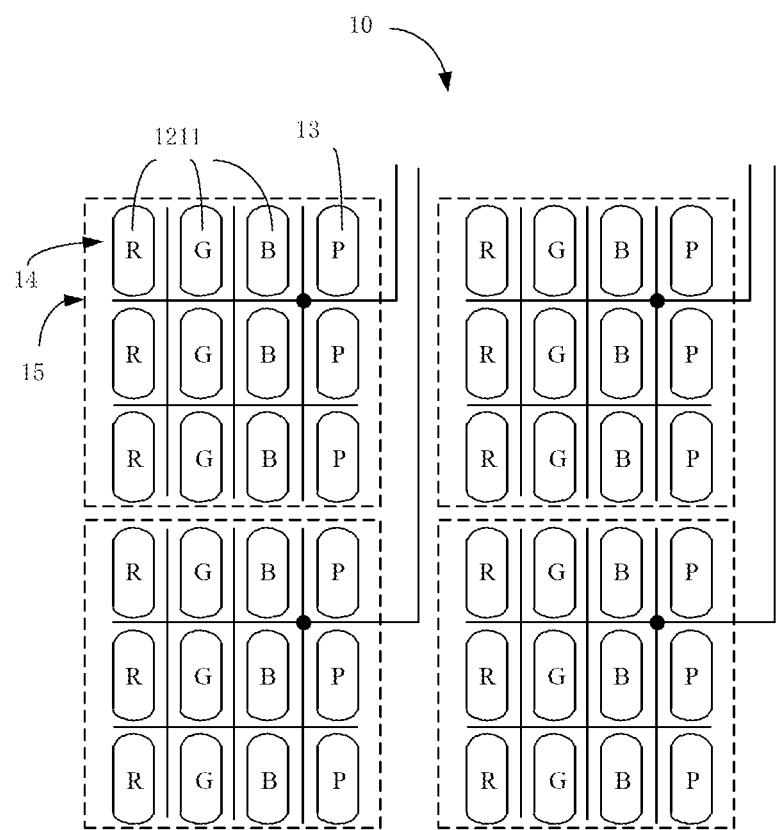
FIG. 2 is a schematic view of a display panel of a second exemplary embodiment of the present disclosure.
Figure 3:
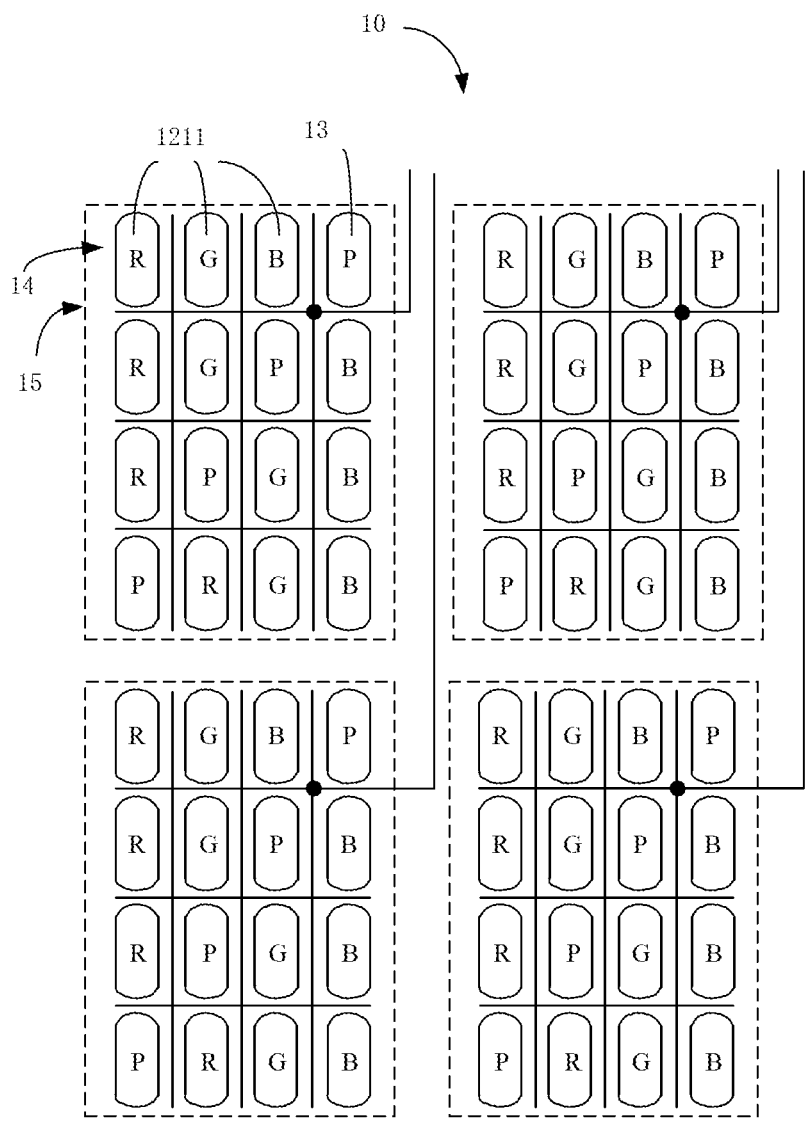
FIG. 3 is a schematic view of a display panel of a third exemplary embodiment of the present disclosure.

Referring to FIGS. 2 and 3, each of the pixel units 121 includes a plurality of sub-pixels 1211. In one embodiment, each pixel unit 121 can include three sub-pixels 1211. The three sub-pixels 1211 are a red sub-pixel (Red, R) 1211, a green sub-pixel (Green, G) 1211 and a blue sub-pixel (Blue, B) 1211.

A photoelectric unit 14 is formed by combining one pixel unit 121 and one photosensitive element (Photosensitive element, P) 13. The display panel 10 can include a plurality of fingerprint identification units 15. Each fingerprint identification unit 15 includes a plurality of photoelectric units 14.

In one embodiment, each fingerprint identification unit 15 can include three photoelectric units 14 therein. In each photoelectric unit 14, the sub-pixels 1211 and the photosensitive elements (P) 13 are arranged in an RGBP manner to simplify the manufacturing process and improve the yield. In other embodiment, each fingerprint identification unit 15 can include four photoelectric units 14 therein. In four photoelectric units 14, the photosensitive elements (P) 13 are staggeredly arranged in a RGBP, RGPB, RPGB and PRGB manner to thereby improve a uniformity of the photosensitive elements (P) 13 and an identification accuracy.

In one embodiment, the photosensitive elements 13 are formed in the light emitting layer 12. The photosensitive elements 13 are positioned on the circuit layer 112. The photosensitive elements 13 and an anode layer 112 of the light emitting layer 12 are formed in a same layer.

Figure 4:
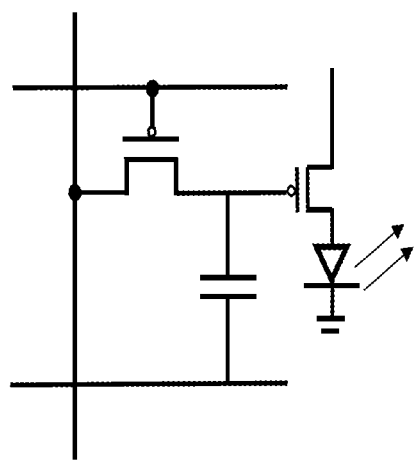
FIG. 4 is a circuit diagram of a sub-pixel of a display panel of one exemplary embodiment of the present disclosure.
Figure 5:
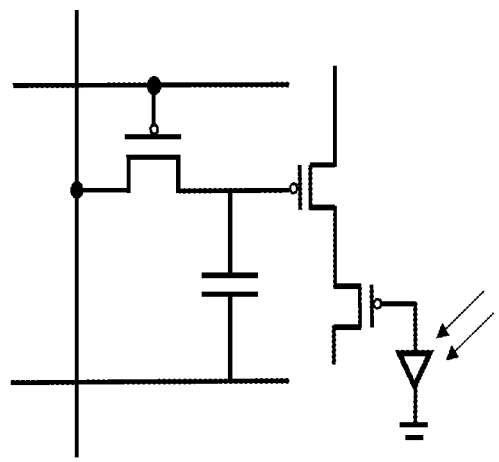
FIG. 5 is a first circuit diagram of a photosensitive element of a display panel of one exemplary embodiment of the present disclosure.
Figure 6:
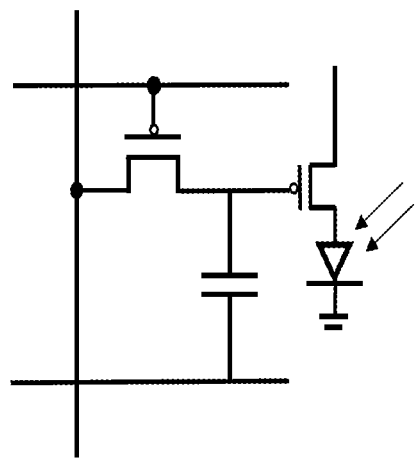
FIG. 6 is a second circuit diagram of a photosensitive element of a display panel of one exemplary embodiment of the present disclosure.

Referring to FIG. 4, a circuit diagram of the sub-pixel 1211 is shown in FIG. 4. Referring to FIG. 5 and FIG. 6, the circuit diagram of the photosensitive elements 13 can be embodied in a manner as shown in FIG. 5, or can be embodied in a manner as shown in FIG. 6.

Figure 7:
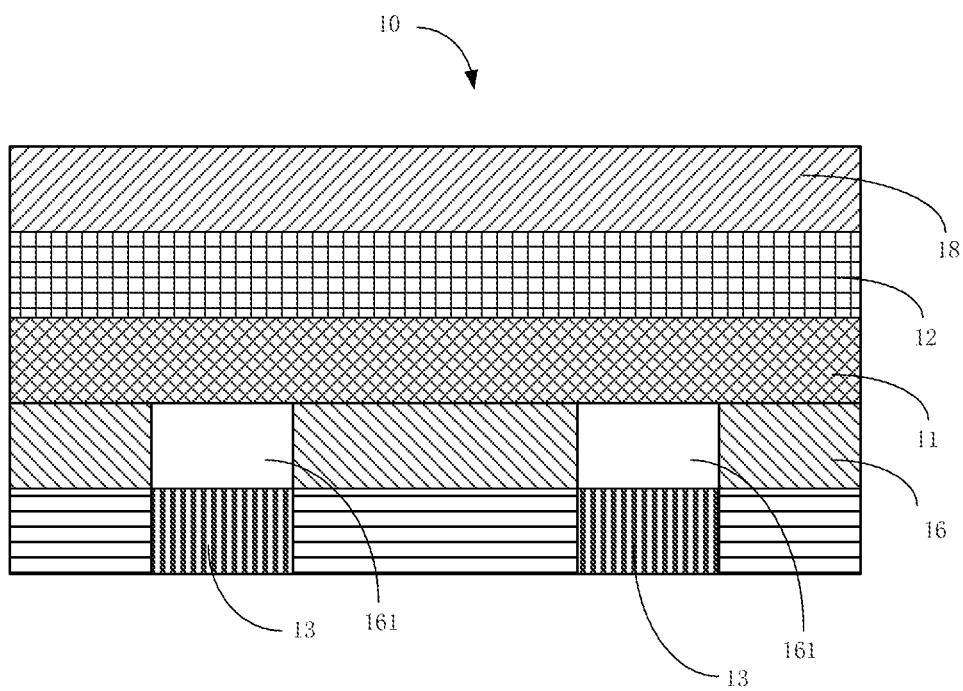
FIG. 7 is a cross-section view of a display panel of a fourth exemplary embodiment of the present disclosure.

Referring to FIG. 7, in one embodiment, the photosensitive elements 13 are formed on a side of the base substrate away from the light emitting layer 12. A filter layer 16 is formed on a side of the substrate layer 11 away from the light emitting layer 12. The photosensitive elements 13 are formed on a side of the filter layer 16 away from the substrate layer 11. A plurality of through holes 161 is defined in the filter layer 16. The light reflected by the fingerprint and emitted by the pixel units 121 passes through the through holes 161, and is received by the photosensitive elements 13 for performing the fingerprint identification.

Figure 8:
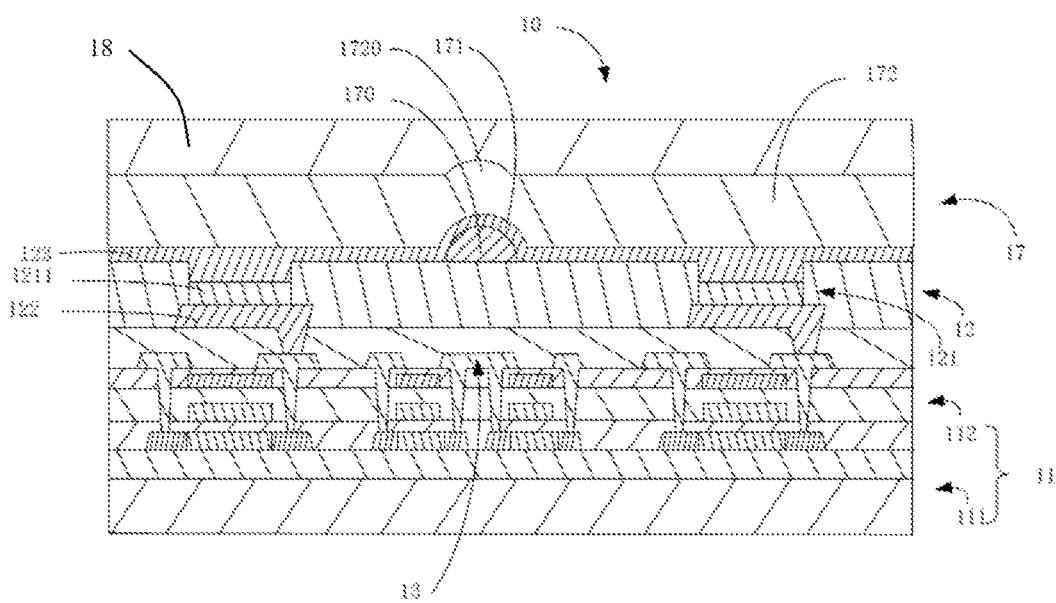
FIG. 8 is a cross-section view of a display panel of a fifth exemplary embodiment of the present disclosure.
Figure 9:
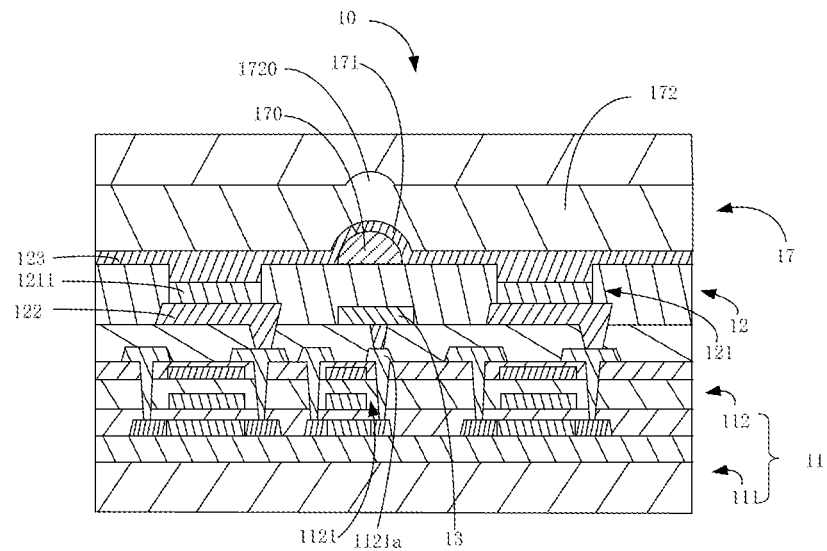
FIG. 9 is a cross-section view of a display panel of a sixth exemplary embodiment of the present disclosure.

Referring to FIG. 8, in one embodiment, the photosensitive elements 13 can be complementary metal oxide semiconductors (CMOS). The photosensitive elements 13 are formed in the circuit layer 112 of the substrate layer 11.

Referring to FIG. 1, the display panel 10 further includes a plurality of lenses 170. The lenses 170 are formed on the light emitting layer 12 of the display panel 10. The cathode layer 123 covers the light emitting layer 12 and the lenses 170. The lenses 170 are sandwiched between the light emitting layer 12 and the cathode layer 123. A plurality of raised portions 171 of the cathode layer 123 is formed on the lenses 170. The lenses 170 and the pixel units 121 are staggered from each other. One lens 170 corresponds one the photosensitive element 13. At least a part of the lenses is formed on a light pathway of the photosensitive elements 13, and the light emitted by the pixel units 121 and reflected by the fingerprint passes through the lenses 170 to reach the photosensitive elements 13.

A thin film encapsulation layer 172 is formed on the cathode layer 123. The thin film encapsulation layer 172 covers the cathode layer 123. The thin film encapsulation layer 172 includes a plurality of protrusions 1720. The protrusions 1720 are formed on a surface of the thin film encapsulation layer 172 away from the cathode layer 123. The protrusions 1720 and the lenses 170 are spaced from each other. One protrusion 1720 and one lens 170 correspond to one photosensitive element 13. The protrusions 1720 and the lenses 170 are formed on a light pathway of the photosensitive elements 13. The light reflected by the fingerprint and emitted by the pixel units 131 passes through the protrusions 1720 and the lenses 170 to the photosensitive elements 13. The lenses 170 and the protrusions 1720 jointly adjust the light emitted by the pixel units 121 and reflected by the fingerprint to improve a sensitivity of a fingerprint identification function of the display panel 10. The protrusions and the lenses can be made of a same material, for example, polystyrene.

The display panel 10 can further include a protective layer 18. The protective layer 18 is formed on the light regulation layer 17 to protect the light regulation layer 17. The light protective layer 18 can be made of glass.

Figure 10:
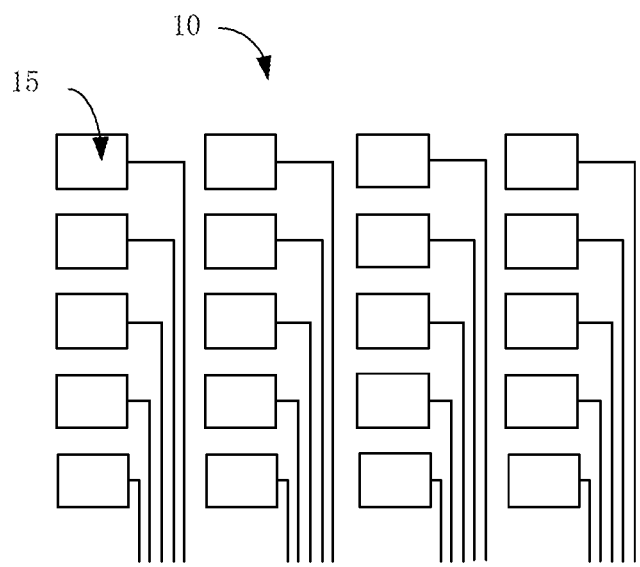
FIG. 10 is a first schematic view of fingerprint identification units of a display panel of the present disclosure.
Figure 11:
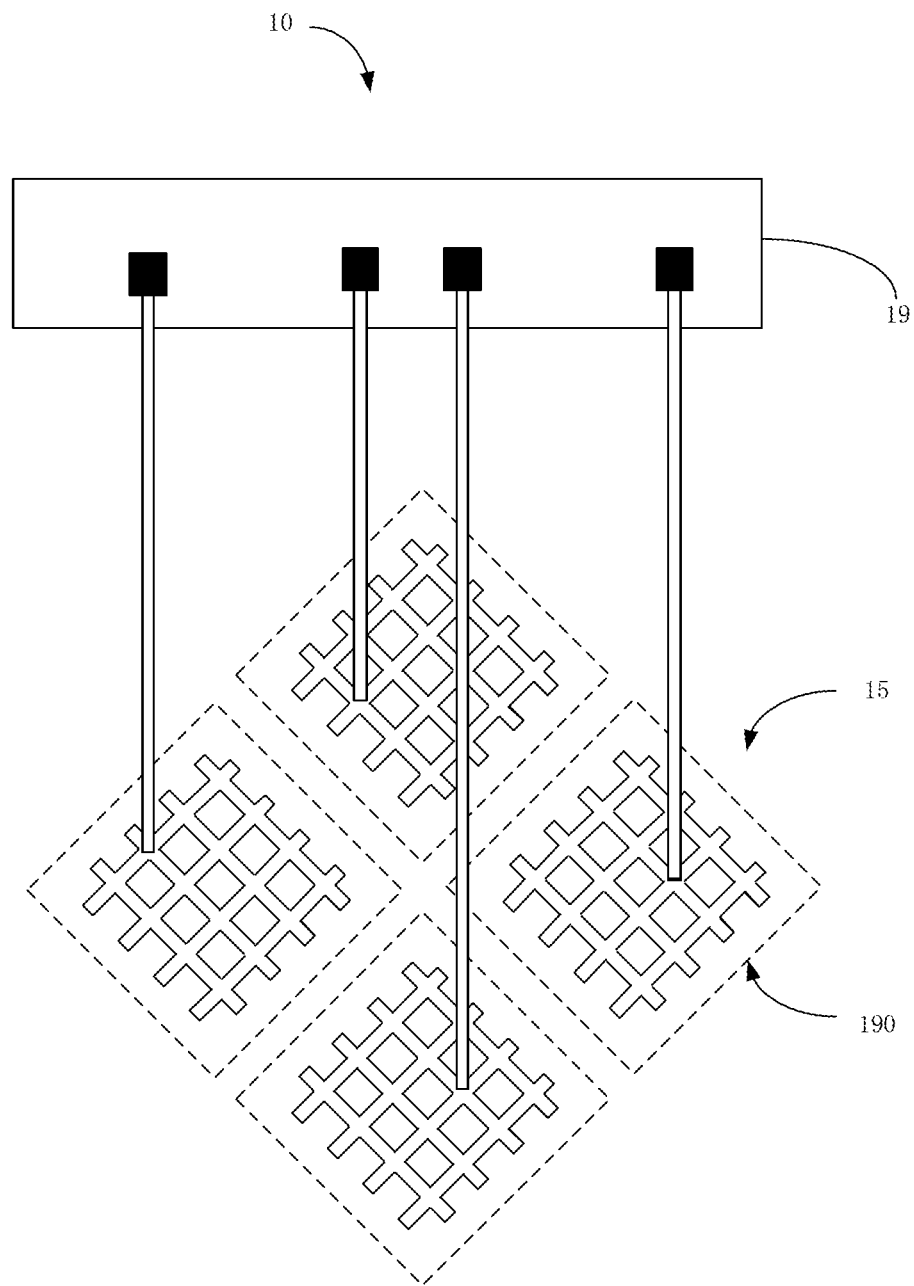
FIG. 11 is a second schematic view of fingerprint identification units of a display panel of the present disclosure.

Referring to FIG. 1, FIG. 10, and FIG. 11, a touch layer 19 can be formed between the light regulation layer 17 and the protective layer 18.

The touch layer 19 includes a plurality of touch units 190 electrically insulated from each other. Each touch unit 190 corresponds to one photoelectric unit 14.

The beneficial effect of the display panel of the present disclosure is that the display panel of the present disclosure includes a substrate layer, a light emitting layer and a plurality of photosensitive elements. The light emitting layer includes a plurality of pixel units. The photosensitive elements are formed between the pixel units. The photosensitive elements are configured to sense light reflected by the fingers and emitted by the pixel units for performing the fingerprint identification, while the light emitted by the light emitting layer is used for display. When the finger touches to the display panel and the light of the light emitting layer is reflected by the finger to the photosensitive elements, the photosensitive elements receive the light for performing the fingerprint identification whereby a display panel which can fulfill a fingerprint identification under the display panel is realized.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A display panel, comprising:
   a substrate layer;
   a light emitting layer formed on the substrate layer, wherein the light emitting layer comprises a plurality of pixel units;
   a plurality of photosensitive elements, wherein the photosensitive elements are formed between the pixel units, the photosensitive elements are configured to sensing light reflected by the fingers and emitted by the pixel units for fingerprint identification, the photosensitive elements are image sensors; and
   a plurality of lenses formed on the light emitting layer of the display panel, wherein at least one lens is formed on a light pathway of the photosensitive elements.

2. The display panel of claim 1, wherein the substrate layer comprises a base substrate, the photosensitive elements are formed between the base substrate and the light emitting layer.

3. The display panel of claim 2, wherein the light emitting layer comprises an anode layer, the anode layer and the photosensitive elements are formed in a same layer.

4. The display panel of claim 3, wherein a plurality of thin film transistors (TFT) is formed between the base substrate and the light emitting layer, each TFT comprises a source/drain electrode, and the source/drain electrodes are electrically connected to the photosensitive elements.

5. The display panel of claim 1, wherein the substrate layer comprises a base substrate, the photosensitive elements are formed on the base substrate away from the light emitting layer.

6. The display panel of claim 5, wherein a filter layer is formed on base substrate away from the light emitting layer, a plurality of through holes is defined in the filter layer, and the photosensitive elements are formed in the through holes.

7. The display panel of claim 1, wherein the display panel further comprises a thin film encapsulation layer, the thin film encapsulation layer covers the light emitting layer and the lenses.

8. The display panel of claim 7, wherein a plurality of protrusions is formed on a surface of the thin film encapsulation layer away from the lighting emitting layer, the protrusions and the lenses are spaced from each other.

9. The display panel of claim 8, wherein the protrusions and lenses are made of a same material.

10. A display panel, comprising:
   a substrate layer;
   a light emitting layer formed on the substrate layer, wherein the light emitting layer comprises a plurality of pixel units;
   a plurality of photosensitive elements, wherein the photosensitive elements are formed between the pixel units, the photosensitive elements are configured to sensing light reflected by the fingers and emitted by the pixel units for fingerprint identification; and
   a plurality of lenses formed on the light emitting layer of the display panel, wherein at least one lens is formed on a light pathway of the photosensitive elements.

11. The display panel of claim 10, wherein the substrate layer comprises a base substrate, the photosensitive elements are formed between the base substrate and the light emitting layer.

12. The display panel of claim 11, wherein the light emitting layer comprises an anode layer, the anode layer and the photosensitive elements are formed in a same layer.

13. The display panel of claim 12, wherein a plurality of thin film transistors (TFT) is formed between the base substrate and the light emitting layer, each TFT comprises a source/drain electrode, and the source/drain electrodes are electrically connected to the photosensitive elements.

14. The display panel of claim 10, wherein the substrate layer comprises a substrate layer, the photosensitive elements are formed on the base substrate away from the light emitting layer.

15. The display panel of claim 14, wherein a filter layer is formed on base substrate away from the light emitting layer, a plurality of through holes is defined in the filter layer, and the photosensitive elements are formed in the through holes.

16. The display panel of claim 10, wherein the display panel further comprises a thin film encapsulation layer, the thin film encapsulation layer covers the light emitting layer and the lenses.

17. The display panel of claim 16, wherein a plurality of protrusions is formed on a surface of the thin film encapsulation layer away from the lighting emitting layer, the protrusions and the lenses are spaced from each other.

18. The display panel of claim 17, wherein the protrusions and lenses are made of a same material.

* * * * *

UNITED STATES PATENT AND TRADEMARK OFFICE
CERTIFICATE OF CORRECTION

PATENT NO. : 10,903,288 B2  
APPLICATION NO. : 16/309381  
DATED : January 26, 2021  
INVENTOR(S) : Jian Ye Page 1 of 1

It is certified that error appears in the above-identified patent and that said Letters Patent is hereby corrected as shown below:

On the Title Page

Add the following:  
(30) Foreign Application Priority Data  
Sept. 12, 2018 (CN).................................................................. 201811060050.3

Signed and Sealed this  
Twenty-sixth Day of October, 2021

Drew Hirshfeld  
*Performing the Functions and Duties of the*  
*Under Secretary of Commerce for Intellectual Property and*  
*Director of the United States Patent and Trademark Office*